United States Patent [19]

Blumberg et al.

[11] Patent Number: 5,773,132
[45] Date of Patent: Jun. 30, 1998

[54] PROTECTING COPPER DIELECTRIC INTERFACE FROM DELAMINATION

[75] Inventors: Lawrence Robert Blumberg, Johnson City; William T. Chen, Endicott; Mark David Poliks, Vestal, all of N.Y.

[73] Assignee: International Business Machines Corporation, Armonk, N.Y.

[21] Appl. No.: 808,141

[22] Filed: Feb. 28, 1997

[51] Int. Cl.[6] .................................................. B32B 3/00
[52] U.S. Cl. ........................... 428/209; 427/98; 427/327; 428/413; 428/901
[58] Field of Search ............................... 427/327, 96, 97, 427/98; 148/240; 428/209, 413, 901

[56] References Cited

U.S. PATENT DOCUMENTS

| | | | |
|---|---|---|---|
| 3,844,799 | 10/1974 | Zucconi | 106/1 |
| 3,950,193 | 4/1976 | Caule | 148/240 X |
| 3,969,237 | 7/1976 | Andress, Jr. | 252/49.9 |
| 4,093,768 | 6/1978 | Cordts et al. | 428/287 |
| 4,428,987 | 1/1984 | Bell et al. | 427/327 |
| 4,534,797 | 8/1985 | King et al. | 106/1.23 |
| 4,821,148 | 4/1989 | Kohayashi et al. | 361/393 |
| 5,091,283 | 2/1992 | Isamu et al. | 430/280 |
| 5,104,734 | 4/1992 | Anschel | 428/336 |

*Primary Examiner*—Michael Lusignan
*Attorney, Agent, or Firm*—Calfee, Halter & Griswold LLP

[57] ABSTRACT

A method of minimizing forming of white spots and delamination of a copper plane bonded to one surface of a dielectric material following additive pattern plating of copper onto the other surface of the material and in vias contacting the copper plane utilizing a plating solution containing a reducing agent and the resulting product is provided. The surface of the copper which has been bonded to the one surface of the dielectric has been treated, preferably by a sodium chlorite treatment to form a chemical roughened surface of copper oxide (CuO and CuO(II)) on the copper. Prior to the bonding, the roughened surface of the copper oxide is treated with a solution such as benzotriazole, which complexes with the copper oxide to prevent formation of white spots and delamination as a result of such plating.

21 Claims, 2 Drawing Sheets

PROTECTING COPPER DIELECTRIC INTERFACE FROM DELAMINATION

FIELD OF THE INVENTION

This invention relates generally to additive plating of copper onto a dielectric substrate laminated to a copper strip, and more particularly to a technique for preventing delamination and other types of failure of the laminate bond between a copper strip and a dielectric substrate during electroless copper plating onto the substrate. In even more particular aspects, this invention relates to the treatment of copper oxide on the surface of a copper strip of material laminated to an epoxy dielectric material to minimize or eliminate delamination of the copper and copper oxide and the epoxy during additive pattern plating of copper onto the epoxy material using plating solutions containing reducing agents such as formaldehyde.

BACKGROUND INFORMATION

One particular technique of forming a circuit board or circuit card utilizes dielectric materials, such as FR4 (which is a glass-reinforced epoxy), laminated to one or more sheets of copper, which copper sheet or sheets act(s) as voltage plane(s). Conventionally, in lamination of copper to epoxy it is required that the copper surface be chemically roughened and a thin copper oxide coating (CuO and CuO(II)) formed on the surface. One conventional way of forming such a roughened oxide coating is by use of a sodium chlorite solution which chemically roughens the surface, forming the requisite oxide which gives the improved bonding action between the copper surface (which has become a copper oxide surface) and the epoxy.

The circuitry for the circuit card or board is conventionally formed on the opposite surface of the epoxy layers from that bonded to the copper oxide by means of photolithographic processes and metal plating techniques. One technique is an additive pattern copper plating wherein the top of the dielectric is seeded with a seed material for the copper material after the vias and through holes have been drilled or otherwise formed. In some cases, the vias extend to or through the copper sheets to form contacts with these copper sheets, and in other cases clearance holes are provided in the copper sheets so that plated through holes or vias can pass through the copper sheets without contact. Photolithographic techniques are then employed using the exposure and development of photoresist to reveal those areas where copper is to be plated. Copper is then additively plated by means of an electroless plating solution. This plating solution contacts the vias and through holes as well as the surface of the dielectric and plates copper onto the contacted surfaces. One such plating solution which is widely used contains formaldehyde and others contain other reducing agents. It has been found that when using plating solutions containing reducing agents such as formaldehyde, there is a tendency to form what is known as white spots in areas adjacent where vias or plated through holes contact the copper sheets. These white spots are regions of incipient delamination between the copper sheets and the epoxy; i.e., there is some reduced resistance to peeling in these regions. These white spots create several problems. First, in many instances, the degree of delamination is not sufficient to cause the board to be unsatisfactory for its ultimate use; however, the white spots interfere with optical screening testing causing a false failure indication. In other instances of more demanding test standards which the board must pass, such as JEDEC highly accelerated testing, the board does fail as a result of delamination.

These failure modes which are generated under accelerated test conditions such as highly accelerated stress testing (HAST) or pressure cooker test (PCT) result from small clusters of white spots which spread and develop into large regions of delamination of the copper and epoxy around the plated through holes and vias.

Thus, it is necessary, in order to have materials that pass optical and JEDEC testing standards and other testing standards to substantially reduce or eliminate such defects caused during the electroless plating of copper onto substrates which are laminated to copper.

SUMMARY OF THE INVENTION

According to the present invention, a method of minimizing forming of white spots and delamination of a copper plane bonded to one surface of a dielectric material following additive pattern plating of copper onto the other surface of the material and in vias contacting the copper plane utilizing a plating solution containing a reducing agent and the resulting product is provided. The surface of the copper which has been bonded to the one surface of the dielectric has been treated, preferably by a sodium chlorite treatment to form a chemical roughened surface of copper oxide (CuO and CuO(II)) on the copper. Prior to the bonding, the roughened surface of the copper oxide is treated with a solution which complexes with the copper oxide to prevent formation of white spots and delamination as a result of such plating.

DESCRIPTION OF THE PREFERRED EMBODIMENT(S)

Figure 1:
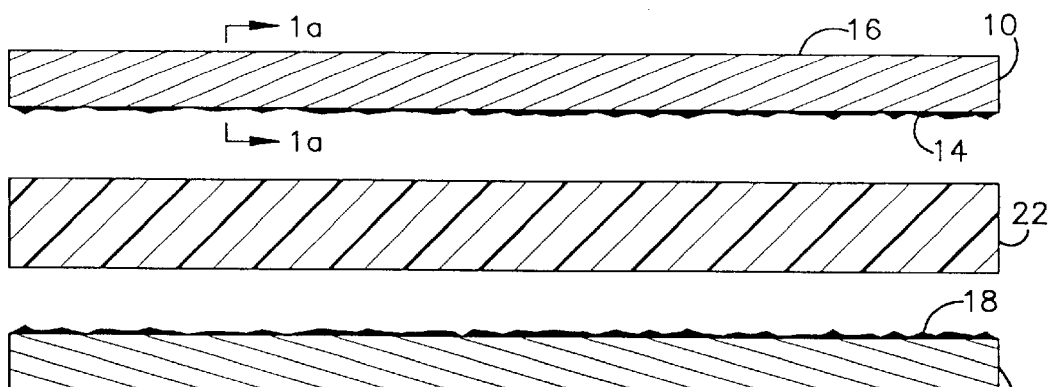
FIG. 1 is a view of two sheets of copper in position to be laminated to an epoxy dielectric substrate.
Figure 1A:
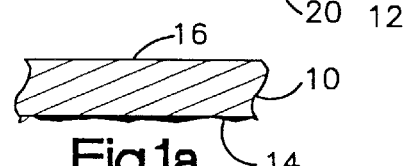
FIG. 1a is a sectional view taken substantially along the plane designated by the line 1a—1a of FIG. 1.

Referring now to the drawings, and for the present to FIGS. 1 and 1a, a pair of copper sheets 10 and 12 having opposed surfaces 14, 16 and 18, 20, respectively, are shown in position to be laminated to a central dielectric substrate 22. The substrate 22 is preferably formed of an epoxy resin, such as FR4 material, which is a glass-reinforced epoxy, and can be conventionally formed by laying up several sheets of FR4 material known as pre-preg and heating the sheets under pressure to partially cure them. Such a technique of forming a central or core material 22 is well known in the art. Other epoxy material, such as Dri-clad, as well as other organic dielectrics, such as polytetrafluoroethylene, polyimides, etc., can be used.

The sheets of copper 10 and 12 are each roughened and provided with an oxide coating on one surface thereof, 14 and 18, respectively. Preferably, the copper sheets 10 and 12 are grade 3, single treat copper foil of the type sold by Gould Corporation. The single treated sides 14 and 18 of the copper sheets 10 and 12, respectively, contain a zinc/copper oxide electroplated onto one surface which is followed by a dip in a chromium salt bath. This results in a roughened oxide surface which is suitable for lamination onto epoxy. Such strip is conventional and can be purchased in various thicknesses, such as ½ ounce, 1 ounce and 2 ounces, as well as other thicknesses. The opposite surfaces, 16 and 20, of the copper sheets 10 and 12, respectively, are smooth and free of oxide, known as "shiny" copper.

Figure 2:
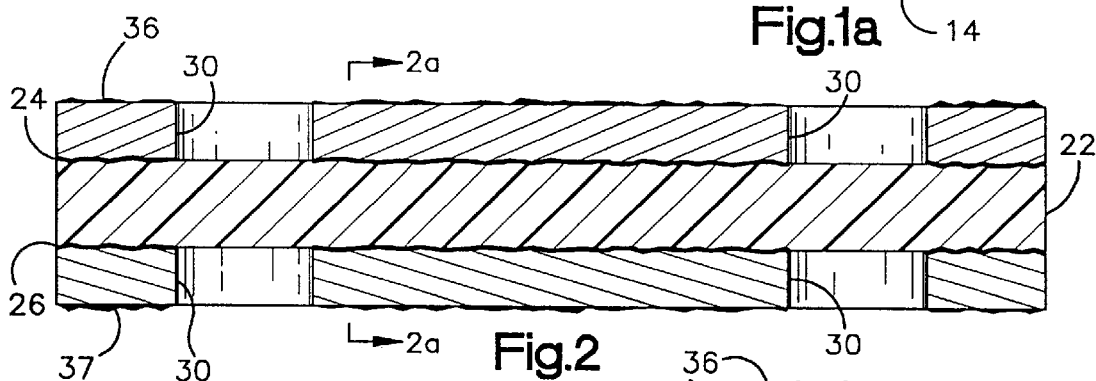
FIG. 2 is a view of two sheets of copper laminated to a glass-filled epoxy core having clearance holes drilled in the copper sheets.
Figure 2A:
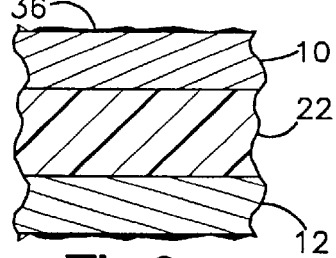
FIG. 2a is a sectional view taken substantially along the plane designated by the line 2a—2a of FIG. 2.

The sheets of copper 10 and 12 are laminated to the FR4 core 22 as shown in FIGS. 2 and 2a, with the surfaces 14 and 18 of the copper sheets 10 and 12, respectively, engaging the core material 22 to form interfaces 24 and 26, respectively. The treatment of the sides 14 and 18 of the copper sheets 10 and 12 makes this copper especially adapted for bonding to dielectric materials, particularly epoxies, such as FR4. Such laminating of epoxy cores to copper sheets is well known in the art.

After the copper sheets 10 and 12 have been bonded to the core 22, clearance holes 30 are formed in each of the copper sheets 10 and 12, preferably by photolithographic processes. This is conventionally done by coating both sides 16 and 20 of the copper with photoresist material, exposing and developing the photoresist material in the areas where the holes 30 are to be formed, and thereafter etching the holes 30 in the copper, followed by stripping the photoresist. This technique of forming the holes 30 is well known in the art.

Following the stripping of the photoresist, the surfaces 16 and 20 of the copper are treated, preferably in a sodium chlorite bath treatment, to form a relatively thin (less than about 1 micron thick) oxide coating designated by the reference characters 36, 37 on the copper sheets 10 and 12 respectively. The reference characters 36 and 37 are used to designate that the surfaces 16 and 20, respectively, are treated in sodium chlorite for roughening and oxide formation. As used herein, "roughened" surface denotes a chemical rather than mechanical roughened surface. This coating is for the purpose of improving the adhesion of the surfaces 36 and 37 to additional sheets of epoxy material which is to be laminated thereto and upon which the circuitry will be formed by electroless plating as will be described presently. The sodium chlorite treatment is done in an aqueous solution of sodium chlorite and sodium hydroxide. Preferably, such solution contains from about 10 to about 14.1 grams of sodium chlorite/100 ml. water and from about 3.5 to about 4.5 grams of sodium hydroxide/100 ml. of water for bout 4 minutes, followed by a water rinse. This will provide a roughened copper oxide CuO and CuO(II) surface.

Following this treatment, the copper oxide surfaces 36, 37 of the copper material 10 and 12 are treated with a material which will complex with the copper oxide and prevent the reduction of the copper oxide when it comes into contact with formaldehyde or other reducing agent in an electroless plating solution, as will be explained presently. The preferred compositions for contacting the surfaces 36, 37 are benzotriazole, substituted benzotriazole, benzothiazole and substituted benzothiazole, although other materials, including azoles which complex with CuO and CuO(II) to prevent reduction thereof, can be used. These materials are described in detail in U.S. Pat. No. 4,428,987 assigned to Shell Oil Company which is incorporated herein by reference as if it were fully set forth. The specific materials for such a treatment are described in the patent as follows:

Treatment Compounds

Suitable copper treatment compounds have the following generalized formula:

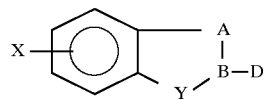

Wherein A is —N= or —S—, B is —N= or —C—, Y is —N= or HN=, D is H, —SH, —SR, or

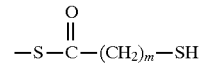

wherein R is an alkyl or aryl radical, and m is an integer from 0 to 10, and X is H, —NH$_2$/

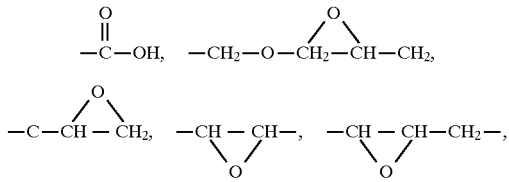

or —OH.

It is relevant to note that non-interfering substituents are selected. For example, if D is —SH or —SR, then X should not contain a

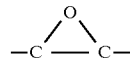

Preferred benzothiazoles have the general formula:

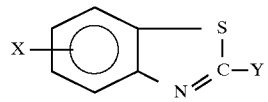

Y is —SH, R, or —S—R and wherein R and X are hereinbefore described.

Preferred benzotriazoles have the general formula:

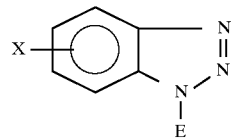

wherein E is hydrogen or a lower alkyl and X is hereinbefore described.

As will be described presently, the treatment of the surfaces 36, 37 with the benzo compound substantially reduces the delamination of the product after electroless plating with a solution containing formaldehyde or other reducing agent, as will be described presently, as opposed to surfaces 36, 37 which have not been treated with the composition. The preferred solutions are benzotriazole and benzothiazole with the most preferred solution being benzotriazole (BTA) in a concentration of about 2.5–3.5% BTA in H$_2$O. The surfaces 36, 37 are contacted with such a solution for about 1.5 minutes, followed by a water rinse and drying.

Figure 3:
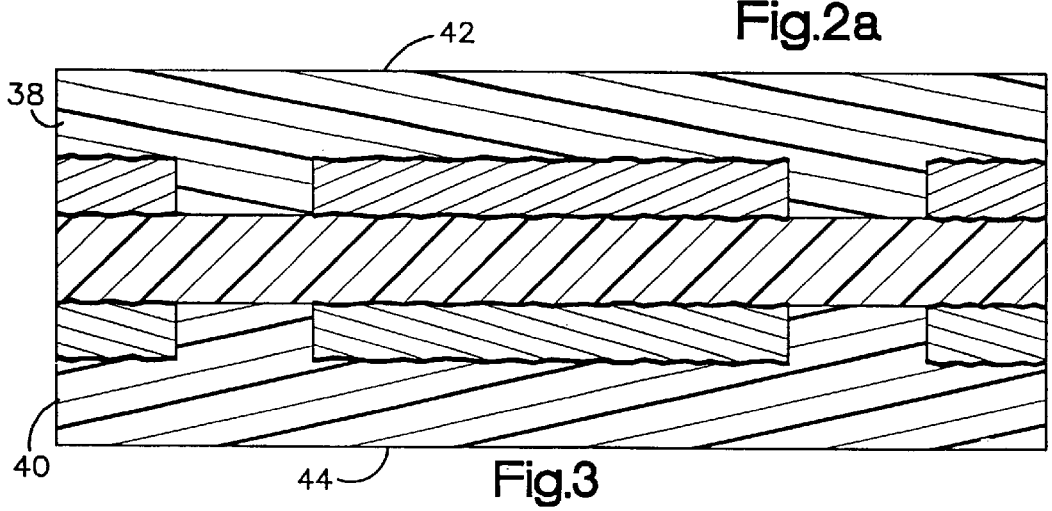
FIG. 3 is a longitudinal sectional view of a composite of the core formed according to FIG. 2 with sheets of epoxy laminated to opposite sides thereof.
Figure 4:
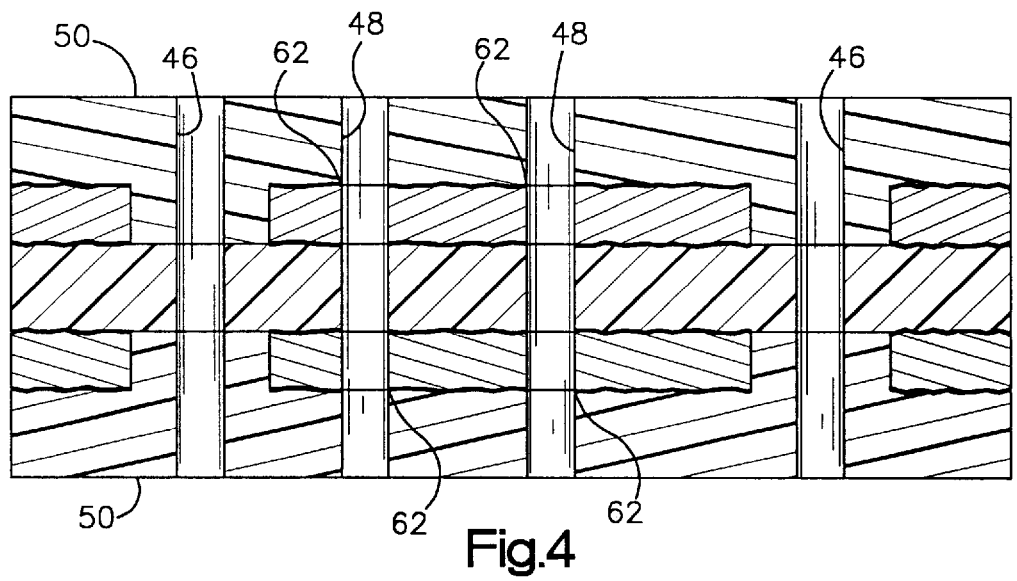
FIG. 4 is a view similar to FIG. 3 with holes drilled and the surface and holes seeded for electroless plating.

After the BTA treatment, a pair of FR4 sticker sheets 38 and 40 are laminated to the treated surfaces 36, 37 of the copper sheets 10 and 12 as shown in FIG. 3 and cured according to conventional techniques. The laminated sheets 38 and 40 each have an exposed surface 42 and 44, respectively, which will be used for the reception of circuitry as will be described presently. (Again, other epoxies, as well as other organic dielectrics, can be used.)

After the sheets 38 and 40 have been laminated to the sheets of copper 10 and 12, holes 46 and via holes 48 are drilled through the final composite material from the surface 42 to the surface 44. The holes 46 pass through holes 30 which have been formed in the copper sheets 10 and 12 and do not contact the copper sheets 10 and 12, whereas the via holes 48 are drilled through the copper sheets 10 and 12, and thus the copper sheets 10 and 12 are exposed within at the holes 48; and when copper is plated in the holes 48 there will be contact between the copper plated in the holes and the copper sheets 10 and 12.

Following the drilling of the holes, the entire surfaces 42 and 44 and clearance holes 46 and via holes 48 are seeded or catalyzed with a seed material for electroless copper plating. Such a process is described in commonly assigned Pat. No. 4,534,797. This seed material typically is palladium particles, and designated by the reference character 50.

Figure 5:
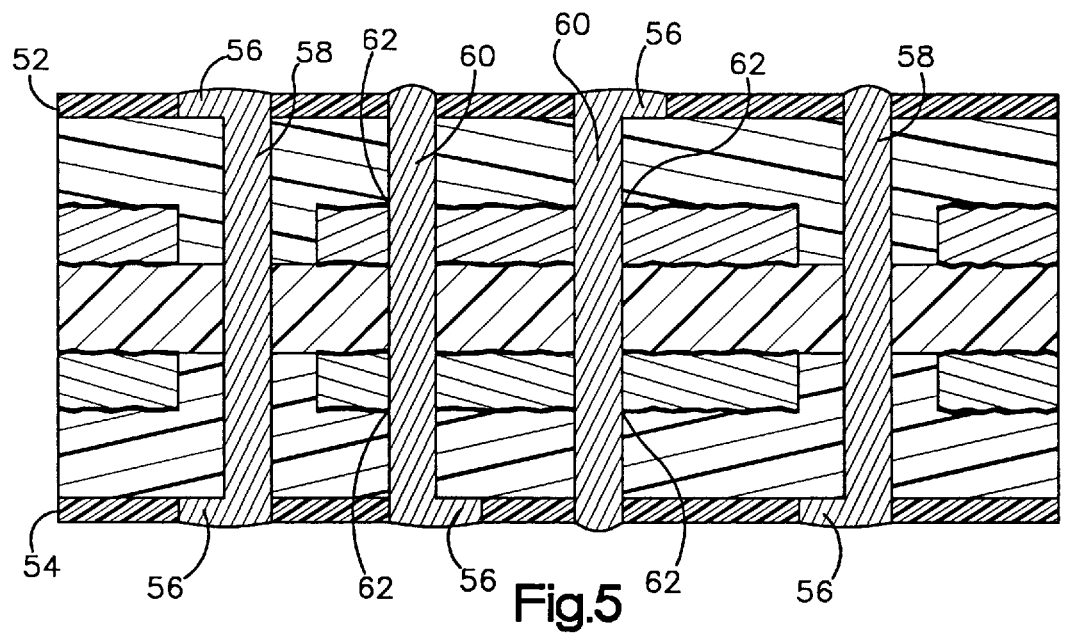
FIG. 5 is a view similar to FIG. 4 with a photoresist material deposited on both sides thereof exposed and developed, and electroless copper plated on the exposed and developed surfaces and into the through holes and vias.

After this seed material has been applied, photoresists 52 and 54 are applied to the seeded surfaces 42 and 44 and exposed and developed in the pattern in which circuitry is to be applied to the surfaces 42 and 44 of epoxy sheets 38 and 40 and around the holes 46 and 48. The surfaces 42 and 44 and holes 46 and 48 having previously been seeded with seed 50, are treated with electroless plating solution to electrolessly plate the circuitry 56 on surfaces 42 and 44, and in the through holes 58 and vias 60 as shown in FIG. 5.

The preferred plating solution and conditions are described in commonly assigned U.S. Pat. No. 3,844,799, as well as U.S. Pat. No. 4,534,797. These patents disclose the use of formaldehyde, homopolymers of formaldehyde and formaldehyde precursors. These are reducing agents. It has been found that the plating solution containing reducing agents such as formaldehyde tends to permeate through the epoxy sheets 42 and 44; and, where the solution contacts the surfaces 16 and 20 of the copper sheets where they contact the vias 60 as shown at 62 in FIG. 5, the formaldehyde tends to cause the phenomenon of "white spots" in this area. As indicated above, these white spots are regions of incipient delamination and tend to interfere with optical testing of the board giving a false indication of failure where under some criteria the board is satisfactory and meets requisites. Also as indicated above, under accelerated testing, these white spots tend to agglomerate and grow, resulting in massive delamination when the surfaces 36, 37 have not been treated with the BTA or other material to complex with the CuO and CuO(II).

In order to determine the constituent causing the "white spot" phenomenon, solutions for plating containing formaldehyde, and similar solutions, except without formaldehyde, were applied. Solutions without formaldehyde did not cause the "white spot" phenomenon, thus indicating it was the reducing agent, formaldehyde, that caused such failure.

To demonstrate the effectiveness of the treatment in BTA, several samples of circuitry were formed as described previously. In preparing one set of samples, the BTA treatment following the sodium chlorite treatment was used, and in another set of samples the BTA treatment was not used and no treatment was given to the surfaces of the copper following the treatment in the sodium chlorite. The processing through the final copper plating and stripping of the photoresist was identical, except that in one set of samples the BTA treatment was used and in the other set no treatment was given the surfaces after the sodium chlorite treatment. In those samples treated with BTA, there was no indication of white spots; however, in those samples not treated with BTA, white spots were present.

Several tests were performed on these two sets of samples. One of these tests is the so-called Highly Accelerated Stress Test (HAST) in which the specimens are placed in a Hast Chamber at 135° C. with 85% relative humidity for 100 hours. When these two sets of samples were so tested, those which had the BTA treatment had essentially no delamination or white spots, whereas those that were not treated with the BTA experienced white spot development and growth with attendant delamination at the copper epoxy interfaces designated at 62 in FIG. 5. Also, a so-called pressure cooker test (PCT) was performed on two sets of samples in which the samples were placed in an autoclave at 121° C. with 100% relative humidity for 96 hours. Similar results were obtained with the BTA treated samples having little or no delamination or white spots, whereas the sample not having been treated with BTA had extensive white spot delamination radially vias 60 at around the interface areas 62.

It was also determined that the samples which were treated with the BTA increased the typical peel strength of the samples as tested on an Instron machine from about 2 lbs. per inch of width to about 3 lbs. per inch of width on comparable size samples, a 50% increase in peel strength.

The reason for the beneficial effect of the BTA and other similar materials is not completely understood. However, it is believed that the white spots or delamination is due to the plating solution containing formaldehyde diffusing through the resist 52 and 54 and FR4 layers 38 or 40 and contacting surface layer 36 or 37 depending upon which side of the dielectric it is coming from. The copper plating 60 in vias 48 provides the electrical properties to form an electrical cell which can cause the surface CuO and CuO(II) to reduce to elemental copper in the areas 62. It is believed that the BTA or other azoles or the like form a complex with the CuO and CuO(II) which prevents such reduction to elemental copper, thus insuring a continuing, strong bond. However, no matter what the mechanism, the treatment of the CuO and CuO(II) with these azoles or the like significantly reduces or prevents such white spot delamination during electroless plating from a solution containing a reducing agent.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of minimizing delamination of copper oxide bonded to one surface of a dielectric substrate following additive pattern plating of copper to the other surface of said dielectric substrate utilizing a plating solution containing a reducing agent for copper oxides; and wherein the surface of said copper oxide which has been bonded to said one surface of said dielectric has been treated to form a roughened surface of copper oxides, said method comprising the step of:

contacting said roughened oxide surface of said copper with a solution containing a material that will complex with copper oxides and prevent the reduction to elemental copper in the presence of a copper oxide reducing agent.

2. The method of claim 1 wherein said material is selected from the group of benzotriazole, substituted benzotriazole, benzothiazole and substituted benzothiazole.

3. The method of claim 1 wherein said material is selected from the group benzotriazole and benzothiazole.

4. The method of claim 1 wherein said reducing agent is selected from the group formaldehyde, formaldehyde precursors and formaldehyde homopolymers.

5. The method of claim 2 wherein said reducing agent is selected from the group formaldehyde, formaldehyde precursors and formaldehyde homopolymers.

6. The method of claim 3 wherein said reducing agent is selected from the group formaldehyde, formaldehyde precursors and formaldehyde homopolymers.

7. The method of claim 1 wherein said reducing agent is formaldehyde.

8. The method of claim 2 wherein said reducing agent is formaldehyde.

9. The method of claim 3 wherein said reducing agent is formaldehyde.

10. The method of claim 1 wherein said dielectric is an epoxy.

11. The method of claim 2 wherein said dielectric is an epoxy.

12. The method of claim 3 wherein said dielectric is an epoxy.

13. The method of claim 4 wherein said dielectric is an epoxy.

14. The method of claim 5 wherein said dielectric is an epoxy.

15. The method of claim 6 wherein said dielectric is an epoxy.

16. The method of claim 7 wherein said dielectric is an epoxy.

17. The method of claim 8 wherein said dielectric is an epoxy.

18. The method of claim 9 wherein said dielectric is an epoxy.

19. A circuitized structure comprising at least one sheet of copper having a first roughened surface bonded to one surface of a first dielectric substrate and a second roughened surface having an oxide of CuO and CuO(II) thereon bonded to a first surface of a second substrate and a second surface having electroless plated copper circuitry thereon, at least one via extending from said second surface of said second dielectric substrate into contact with said copper sheet, copper additively pattern plated into said one via, and a complexing agent disposed on said CuO and CuO(II).

20. The invention as defined in claim 19 wherein said complexing agent is selected from the group of benzotriazole, substituted benzotriazole, benzothiazole and substituted benzothiazole.

21. The invention as defined in claim 19 wherein said complexing agent is selected from the group benzotriazole and benzothiazole.

* * * * *